United States Patent [19]

Cistola

[11] 4,076,357
[45] Feb. 28, 1978

[54] LAMINATED PROGRAMMABLE MICROSTRIP INTERCONNECTOR

[75] Inventor: Anthony Bartholemew Cistola, Vestal, N.Y.

[73] Assignee: International Business Machines Corporation, Armonk, N.Y.

[21] Appl. No.: 747,576

[22] Filed: Dec. 6, 1976

[51] Int. Cl.² .......................... H05K 1/07; H05K 1/14
[52] U.S. Cl. ............................ 339/17 M; 339/17 N; 361/413
[58] Field of Search .............. 174/52 FR; 339/17 CF, 339/17 LC, 17 LM, 17 M, 17 N, 143 R, 143 T, 176 M, 176 MP; 361/413

[56] References Cited

U.S. PATENT DOCUMENTS

| 2,885,603 | 5/1959 | Rose | 339/17 LM |
| 3,406,368 | 10/1968 | Curran | 339/17 M |
| 3,605,075 | 9/1971 | Stofkodper | 339/143 R |

OTHER PUBLICATIONS

Straus, Shielded in-line Electrical Multiconnector, IBM Technical Disclosure Bulletin vol. 10, No. 3 pp. 203–204, Aug. 1967.

*Primary Examiner*—Neil Abrams
*Attorney, Agent, or Firm*—Norman R. Bardales

[57] ABSTRACT

An electrical interconnector is formed of discrete laminate members. The basic configuration has a printed circuit substrate member interleaved between two ground plane members. Predetermined first and second printed circuit conductor patterns are on opposite sides of the printed circuit substrate, each interacting as a signal plane with the particular one of the ground plane members that is juxtaposed to it. The two patterns are interconnected by severable conductive means located at one or more predetermined locations across at least one edge of the substrate. Programmability is effected by severing one or more of the conductive means in the desired interconnection pattern. The basic configuration when arrayed with other similar basic configurations provides modular construction. Each basic configuration, hereinafter referred to sometimes as a section, in the array is separated from its adjacent section by another laminate member which is an insulator. The spacer member and its associated adjacent sections are configured to form a raceway, i.e. a duct or channel, for running insulated wire conductors which may be used, if desired, to interconnect predetermined ones of the printed circuit conductors associated with the interconnector. The interconnector is adapted to have the terminals of electrical devices mounted along the laminar edges of the interconnector.

10 Claims, 6 Drawing Figures

LAMINATED PROGRAMMABLE MICROSTRIP INTERCONNECTOR

BACKGROUND OF THE INVENTION

1. Field of the Invention

This invention relates to electrical interconnectors and particularly to electrical interconnectors useful for electronic packaging and the like.

2. Description of the Prior Art

In electronic packaging, it is often desirous to interconnect one electrical device, e.g. a circuit module or chip, to another electrical device, e.g. a printed circuit board, by means of an interconnector. By way of example, there is described in the publication entitled "Connector Interposer For Module-To-Board Electrical Interconnection", R. L. Agard et al, IBM Technical Disclosure Bulletin, Vol. 15, No. 3, August 1972, page 912, a planar interconnector which uses metallized through-holes for making connection between the pins of a circuit module mounted on top of the interconnector and the connector pins of a printed circuit board located beneath the interconnector. Also, for example, in the publication entitled "Low-Noise Interconnection System For Monolithic Modules", L. T. Olson, IBM Technical Disclosure Bulletin, Vol. 9, No. 4, September 1966, page 360, interconnection of monolithic modules is effected by a planar interconnector. Briefly, the pins of the monolithic modules are fitted into the openings of the planar interconnector, referred to as an interface card, where they contact printed circuit jumpers of the card.

It is also known in the prior art to interleave ground planes in between a stack of printed circuit boards and provide a jumper connection across the edge of a printed circuit board of the stack so as to connect the circuits on one side of the particular board to the circuits on its opposite side, cf. "Printed Circuit Connector", J. P. G. Dunman, IBM Technical Disclosure Bulletin, Vol. 7, No. 3, August 1964, page 182.

However, heretofore in the prior art of which I am aware, the electrical devices to be interconnected by these planar interconnectors were mounted on the planar sides of the interconnector. Thus, these prior art apparatus were not conducive to large scale programmability and/or modular constructability.

SUMMARY OF THE INVENTION

It is an object of this invention to provide a programmable interconnector.

It is another object of this invention to provide an interconnector of the aforedescribed kind which is amenable to modular construction.

Still another object of this invention is to provide an interconnector of the aforementioned kind which has microstrip and/or rf shielding characteristics.

Still another object of this invention is to provide an interconnector of the aforementioned kind which is particularly useful for large scale integration circuit packaging.

Still another object of this invention is to provide an interconnector of the aforementioned kind for interconnection of pluggable devices and/or a circuitized assembly.

Still another object of this invention is to provide an interconnector of the aforementioned kind which is amenable to engineering changes in the field.

According to one aspect of the invention, there is provided an electrical interconnector apparatus for interconnecting the terminals of at least two electrical devices. The apparatus includes at least one lamination having first and second predetermined printed circuit conductor patterns on the opposing first and second planar sides, respectively, of the lamination. Severable conductor means connect the first and second predetermined patterns at predetermined locations across at least one edge of the lamination. First and second ground plane laminations are disposed adjacent the first and second conductor patterns, respectively. The first and second conductor patterns are in signal plane relationship with the first and second ground plane laminations, respectively. Contact means are disposed along at least one laminar edge of the interconnector apparatus and are adapted to be connectable to the electrical device terminals. The contact means are coupled to predetermined ones of the printed circuit conductors of at least one of the first and second patterns.

The foregoing and other objects, features and advantages of the invention will be apparent from the following more particular description of the preferred embodiments of the invention, as illustrated in the accompanying drawing.

BRIEF DESCRIPTION OF THE DRAWING

In the FIGURES, like elements are designated with similar reference characters.

DESCRIPTION OF THE PREFERRED EMBODIMENTS

Figure 1:
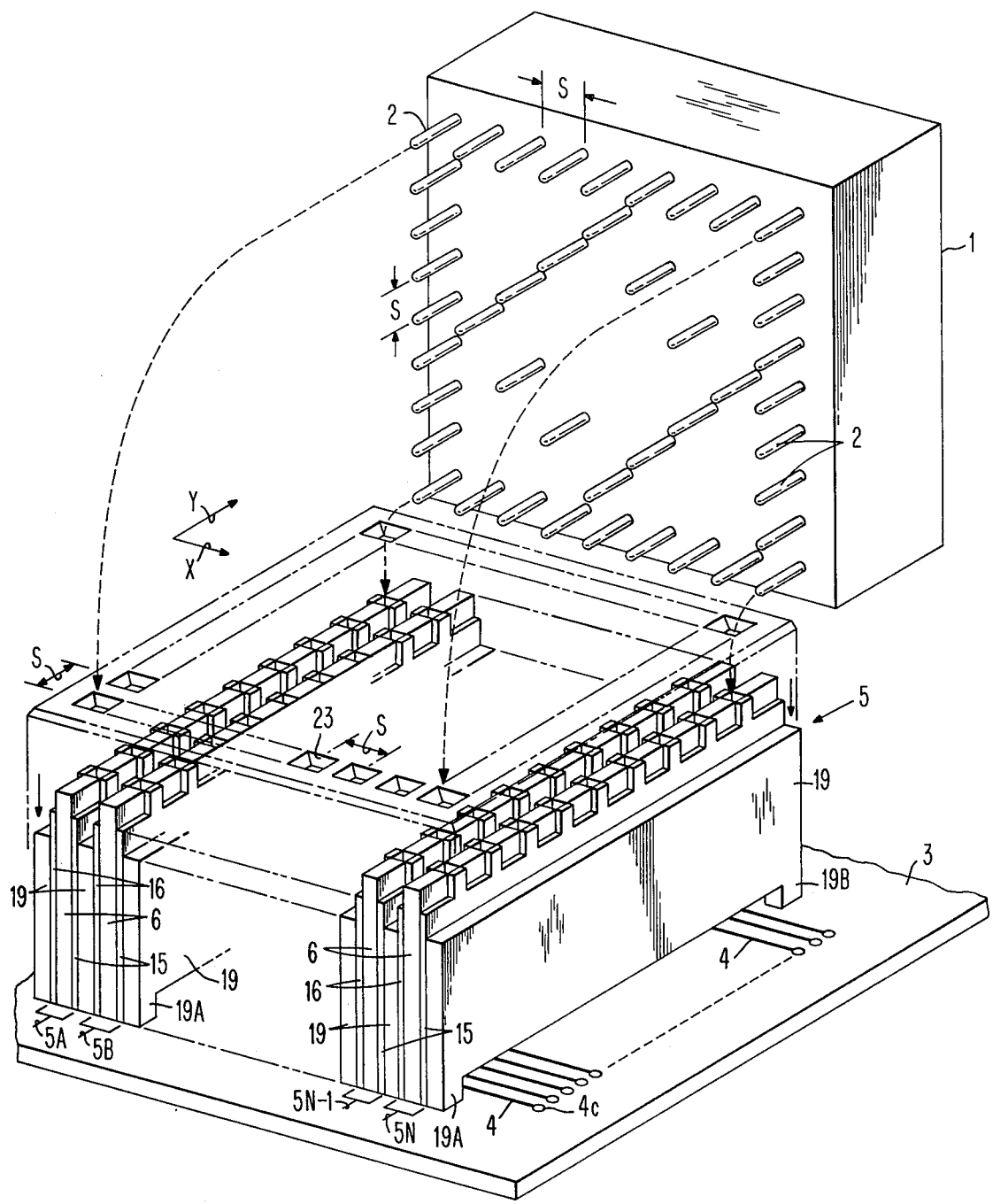
FIG. 1 is a perspective and partially exploded view schematically illustrating a preferred embodiment of the interconnector of the present invention.

Referring to FIGS. 1-4, interconnection between a circuit module device 1 having pin terminals 2 and a circuitized assembly such as a printed circuit board device 3 having printed circuit conductor pattern 4 is provided by a preferred embodiment of the electrical interconnector apparatus of the present invention, i.e. interconnector 5. Board 3 is preferably a multilayer printed circuit board. As partially shown schematically in FIG. 3, board 3 has appropriate contact pads 4a, via holes 4b and terminal contacts 4c. Interconnector 5 is formed of discrete laminate members arranged in plural identical modular sections 5A, 5B, etc.

Figure 2:
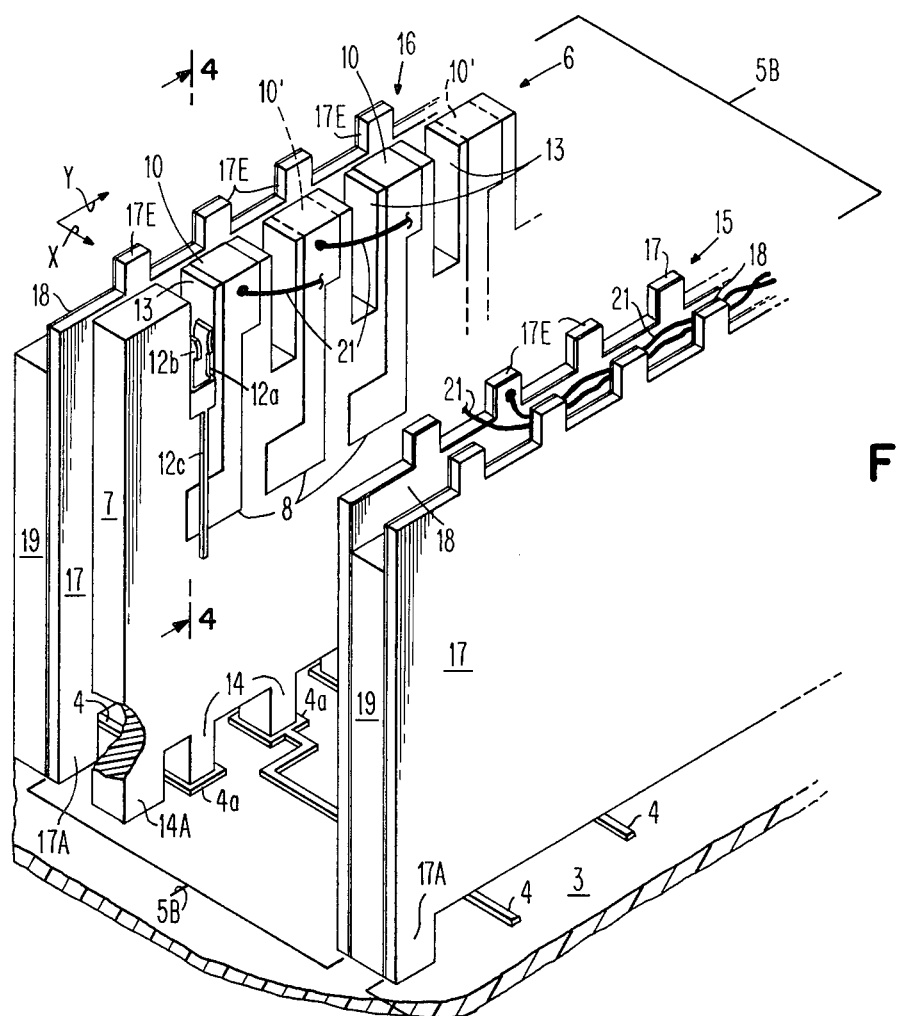
FIG. 2 is a perspective and exploded view, partially broken away, of the embodiment of FIG. 1.
Figure 4:
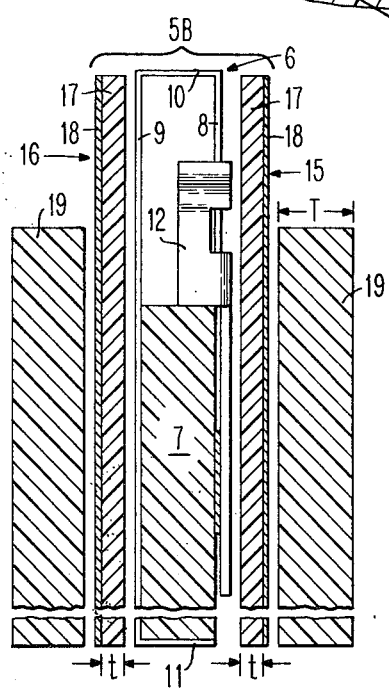
FIG. 4 is a side elevation view of one modular section of the embodiment of FIG. 1 taken along the line 4—4 of FIG. 2.

Each of the sections 5A, 5B, etc., has a lamination 6 which includes a printed circuit substrate 7 with first and second predetermined printed circuit conductor patterns 8, 9 that are disposed on its opposite planar surfaces or sides, cf. for example, section 5B shown in greater detail in FIGS. 2 and 4. By way of example, the individual conductors of pattern 8 are configured with identical S-like shapes across the side of substrate 7, as shown in FIG. 2. Again by way of example, the individual conductors of pattern 9 are configured with identical elongated shapes running from the top to the bottom edges of substrate 7, cf. FIG. 4. By way of further example, each of the conductors of pattern 8 is aligned with one of the conductors of pattern 9, hereinafter referred to sometimes as an aligned pair.

Severable conductor means 10, 10', which preferably are also printed circuit conductors formed concurrently with patterns 8 and/or 9 in a wrap-around manner, connect the patterns 8, 9 across at least one laminar edge of lamination 6 at predetermined locations. In the embodiment of FIG. 1, for sake of simplicity, the conductors 10, 10' are symmetrically disposed across the top edge of lamination 6. For the particular example of conductor patterns 8, 9, each of the conductors 10, 10' integrally connects, i.e bridges, the two conductors of one of the aforementioned aligned pairs of conductors of patterns 8, 9. As hereinafter explained, the conductors designated 10' have been severed but are shown in phantom outline in FIG. 2, for sake of clarity.

Interconnector 5 has contact means, e.g. the printed circuit conductor lands 11 shown in FIG. 4 and/or the bifurcated spring connectors or receptacles 12 of which only one is shown in FIG. 2 for sake of clarity. Lands 11 and connectors 12 are disposed along the bottom and top edges, respectively, of laminate 6. The pair of contact plates 12a, 12b of each connector 12 are symmetrically housed in one of the symmetrical recesses 13 formed inwardly from the top edge of laminate 6. The common stem portion 12c is affixed to the bottom land of the adjacent S-shaped conductor of pattern 8, for example, by a solder bond. The bottom edge of laminate 6 is also symmetrically and inwardly recessed to form inner legs 14. Each land 11 is aligned with the bottom edge of one of the conductors of pattern 9 and is preferably integrally formed therewith in a wrap-around manner. Thus, as shown in FIG. 4, printed circuit conductors 8, 9, 10, 11 are integral. Receptacles 12 are coactable with the terminal pins 2 of pluggable module 1, and lands 11 are coactable, e.g. by solder bond, with conductor pads, e.g. pad 4a, that are part of the printed circuit conductor pattern 4 of board 3.

Each modular section of the embodiment of FIG. 1 also includes a pair of lamination members 15, 16 that act as reference voltage, e.g. ground, planes for the conductor patterns 8, 9, respectively, of the particular member 6 that is interleaved between them. More particularly, each of the members 15, 16 has a dielectric substrate 17 of thickness t that supports an integral conductive layer 18. Members 15, 16 are oriented so that their respective conductive layers 18 face outwardly with respect to the particular member 6 with which they are associated, as shown in FIG. 4. As is apparent to those skilled in the art, when the respective bare surfaces of substrates 17 of members 15, 16 of a particular section are placed in contacting relationship with the adjacent surfaces of intermediate member 6, the conductor patterns 8 and 9 thereof are in signal plane relationships with the respective conductive layers 18 of members 15 and 16, respectively.

On each of the side edges of members 15, 16, as well as member 6, there is formed an integral leg or pedestal, for example, leg 17A of member 16 and leg 14A of member 6, FIG. 2, to provide clearance for the printed circuit conductors of pattern 4 of the underlying board 3. The top edges of members 16, 17 are provided with integral extensions 17E. The extensions 17E are aligned in pairs. Each pair has one extension 17E from member 16 and one from member 15, the two members 15, 16 being associated with the same modular section. Each of the pair of extensions 17E in turn is aligned with one of the recesses 13 of member 6 of the particular section, thus enclosing the open sides of the particular recess 13 when the members 6, 15, 16 are assembled in the aforedescribed contacting relationship.

Between adjacent modular sections, i.e. sections 5A and 5B, 5B and 5C, etc., an insulated spacer lamination member 19 is provided. Also, if desired, an identical member 19 may also be provided adjacent the respective outer faces of the first and last sections 5A and 5N, as shown in FIG. 1. For purposes of explanation, it will be assumed that the pins 2 of device 3 have equal spacings S in the X and Y directions. Accordingly, each of the respective center spacings in the Y direction between adjacent recesses 13 for the same member 6 are substantially equal to S. Likewise, by judiciously selecting the thickness dimensions of members 6, 15, 16 and 19, an equal spacing S in the X direction between the centers of the corresponding aligned recesses 13 of the identical members 6 of adjacent modular sections is provided. Each of the members 19 are provided with integral legs or pedestals 19A, 19B which are in alignment with the corresponding respective legs, e.g. legs 14A, 17A, of members 6, 15, 16, so as to provide clearance for the printed circuit conductors of pattern 4 of board 3.

Figure 3:
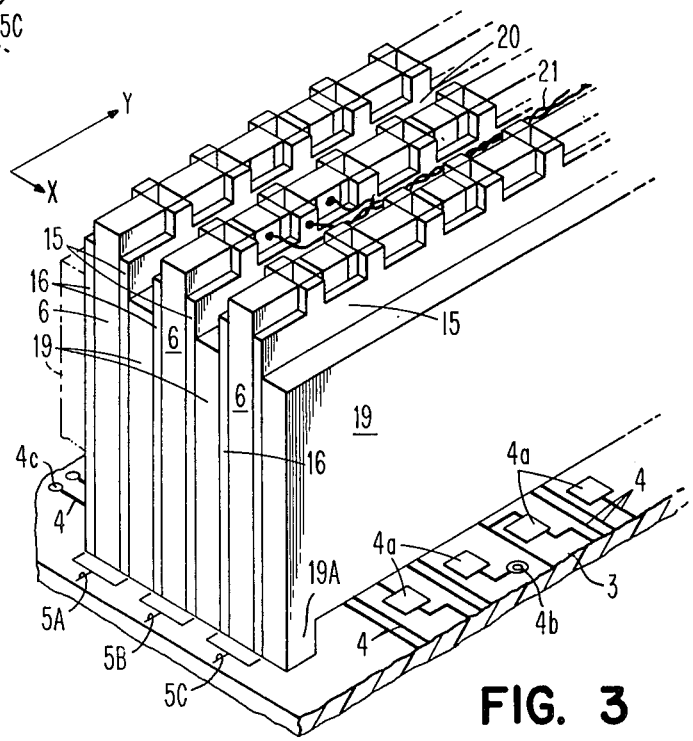
FIG. 3 is a more detailed partial perspective view of the embodiment of FIG. 1.

The interleaved spacer members 19 and adjacent sections, cf. for example, the spacer member 19 between sections 5B and 5C of FIG. 3, are configured to form a wire raceway, duct or channel 20 in which insulated wire conductors, e.g. conductors 21, are run, if desired, to interconnect the printed circuit conductors of patterns 8 and 9 of members 6, as shown in FIG. 3.

An insulator cover 22 having an array of openings 23 compatibly aligned with the array of openings formed by the tops of the recesses 13 fits snugly over the assembly of modular sections 5A-5N and spacer members 19, thus keeping the assembly in alignment. The assembly may also be secured together by suitable fasteners, not shown, such as screws, bolts, clamps, etc.

To program the connector 5, different predetermined ones of the connectors 10 are severed in accordance with the desired interconnection pattern. In FIG. 2, by way of example, every other connector, i.e. those designated by the reference character 10' are severed by, for example, an abrading device. Further programming may be provided by inter and/or intra-connecting via the aforementioned insulated wires, e.g. wire 21, predetermined ones of the upper lands of the conductors of pattern 8 and of those, not shown, of the conductors of pattern 9 on the reverse side, both of which are accessible via the recesses formed between extensions 17E. Moreover, further programming may be effected by removing predetermined one of the lands 11, e.g. by an abrading device. Thus, when the module 1 is plugged into interconnector 5 and the interconnector 5 has been affixed via its lands 11 to the pads 4A of board 3, the interconnector 5 provides interconnection between the devices 1 and 3 in the desired interconnected pattern.

It should be understood that the printed circuit members 6 preferably are each single layer members and all have identical patterns 8 and identical patterns 9. For sake of clarity and by way of example, in any given member 6 the constituent printed circuit members of pattern 8 are not integrally connected to any other of the constituent members of the pattern 8. The same is true for the constituent members of the pattern 9. However, as is apparent to those skilled in the art, the printed circuit members 6 may be multilayer members, and/or have one or more integrally connected constituent printed circuit conductors for at least one of the patterns 8, 9, and/or use via or plated through holes for interconnecting predetermined printed circuit conductors of one of the patterns 8, 9 on the member 6 with predetermined printed circuit conductors of the other pattern of the member, and/or use non-identical but predetermined different printed circuit pattern configurations for the member 6. By judiciously selecting the printed circuit design or configuration patterns 8, 9 and/or with the use of multilayer construction and/or of via holes for the member 6, crossover of its printed circuit conductors is facilitated. In addition, it should be noted that the interconnector 5 will thus enhance the crossover capability of the board 3.

Figure 5:
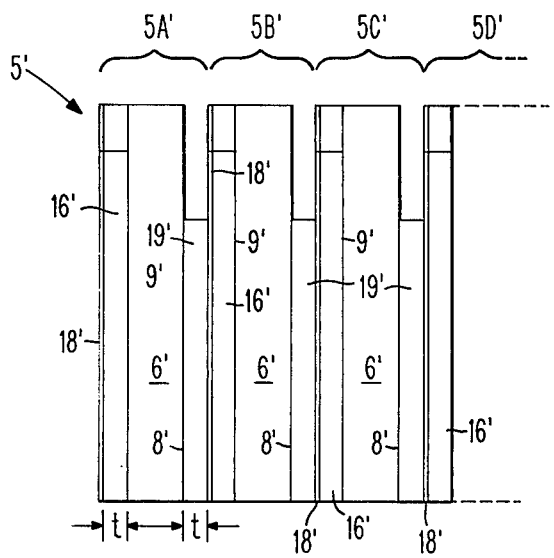
FIG. 5 is a partial side elevation of another embodiment of the present invention.

In the embodiment of FIG. 5, the partially shown interconnector 5 thereof has adjacent modular sections 5A', 5B', etc. Each section has a discrete printed circuit conductor member 6' having printed circuit patterns, not shown, along its planar sides 8', 9'. For sake of explanation, member 6' is identically configured as member 6 of FIG. 1. Each section also has a discrete ground plane member designated 16' with a conductive outer layer 18'. Again for sake of explanation, member 16' is identically configured as member 16 of FIG. 1. The conductor pattern of side 9' of member 6' is in signal plane relationship with the ground plane layer 18' of member 16' of the same section.

Between adjacent sections, there is provided a spacer member 19'. It has a dielectric constant and thickness, the product of which is substantially equivalent to the product of the corresponding parameters of the substrate of a member 16'. By way of example, the thicknesses $t$ of the substrate member 16' and member 19' are illustrated as being substantially equal for the embodiment of FIG. 5. As a result, member 19' in coaction with the layer 18' of a member 16' of one section, e.g. section 5C' interacts with the conductive pattern on side 8' of the member 16' of the preceding adjacent section, e.g. section 5B'. Thus, each section in embodiment 5' is also provided with two ground plane laminations, by the interaction of the particular members 16' and 19', adjacent to the sides 8', 9' of the interleaved member 6'. In other words, each ground plane lamination is common to two sections, viz. the section of which it is a part and the adjacent section.

Figure 6:
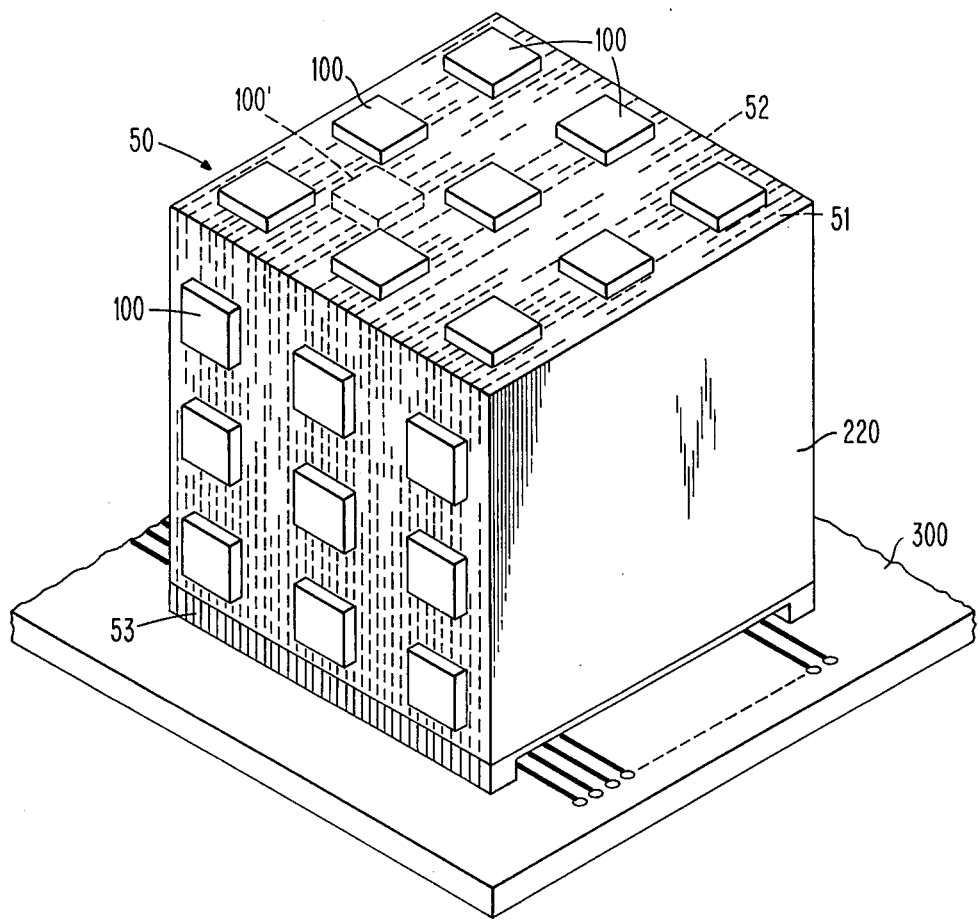
FIG. 6 is a perspective schematic view of still another embodiment of the present invention.

In the embodiment of FIG. 1, the interconnector 5 is shown as interconnecting only two devices 1, 3. As is apparent to those skilled in the art, the interconnector can be expanded in its X and/or directions to accommodate more devices, i.e. device 1. In addition, the vertical laminar edges of the interconnection 5 can be expanded and provided with severable connector means and recesses for accommodating receptacles in a similar manner as the recesses 13 and receptacles 12 are provided at the top laminar edge, thus allowing more pluggable devices 1 to pluggably mounted to the interconnector along its laminated expanded vertical sides. By way of example, there is shown in FIG. 6, an embodiment of an interconnector 50 having 3×3 arrays of pluggable modules 100 mounted through a cover 220 to the top and side laminar edge faces 51, 52, 53 of the interconnector 50. Insulator cover 220 is provided with an array of openings, not shown, compatible to the pin array of the modules 100. The bottom face of the interconnector 50 is interconnected to a multilayer printed circuit board 300 in a manner similar to the interconnection of the connector 5 to board 3 of FIG. 1.

The interconnector of the present invention may be modified to include several interconnection patterns in a single unit. Thus, each device or combination of devices to be interconnected has several optional predetermined mounting positions on the interconnector, at any one of which the particular device is connected to a different interconnection pattern. By way of example, there is shown in phantom outline in FIG. 6 one of the devices 100 designated by the reference number 100' that is mounted in an optional position by which it is interconnected to another interconnection pattern of the interconnector 50.

As shown, connectors 12 are discrete components solder bonded to the conductors 8. In lieu thereof, printed circuit spring connectors may be integrally formed with the conductor patterns 8, 9, the contact faces being parallel to the planar sides of the substrate 7.

Preferably, each of the conductive layers 18, 18' is a continuous and integral member which covers the particular surface of its associated substrate 17. However, it should be understood that one or more of the conductive layers may be severed so as to form two or more electrically isolated sections on the substrate 17 so that different reference voltage levels may be applied to the different severed sections.

In certain applications such as where impedance matching and rf shielding are not critical, the reference voltage plane members may be obviated, if desired.

Morever, the spacer members 19 may be configured to house discrete electrical components which are part of the associated circuitry and which are, for example, terminating resistors, decoupling capacitors, diodes, transistors and the like. By way of example, the member 19 may be moulded into a planar configuration which encompasses or includes the electrical components in a manner apparent to those skilled in the art.

The interconnector of the present invention thus provides increased versatility, programmability, and/or microstrip and rf shielding constructability. Morever, engineering changes can be readily made by severing the accessible bridge connectors, e.g. connector 10, and/or making connections with the insulated wire conductors, e.g. conductor 21, and/or positioning the pluggable devices to the various optional mounting positions. These engineering changes, morever, can be accomplished in the field.

While the invention has been particularly shown and described with reference to preferred embodiments thereof, it will be understood by those skilled in the art that the foregoing and other changes in form and details may be made therein without departing from the spirit and scope of the invention.

What is claimed is:

1. Electrical interconnector apparatus for interconnecting the terminals of at least two electrical devices, said apparatus comprising:
    at least one lamination having first and second predetermined printed circuit conductor patterns on the opposing first and second planar sides, respectively, of said lamination,
    severable conductor means for connecting said first and second predetermined patterns at predetermined locations across at least one edge of said lamination,
    first and second reference voltage plane laminations disposed adjacent said first and second conductor patterns, respectively, said first and second conductor patterns being in signal plane relationships with said first and second reference voltage plane laminations, respectively, in a microstrip manner, and contact means disposed along at least one laminar edge of said interconnector apparatus adapted to be connectable to said electrical device terminals, said contact means being coupled to predetermined ones of the printed circuit conductors of at least one of said first and second patterns, said one laminar edge being normal to said first and second planar sides, recesses formed in at least one edge of said one lamination, some of said contact means being located within said recesses 2. Electrical interconnector apparatus according to claim 1 wherein one of said two devices is a pluggable circuit module having pins as said terminals thereof and wherein the other of said two devices is a printed circuit board having a predetermined circuit conductor third pattern including printed circuit contact pads as said terminals thereof, some of said contact means comprising receptacles disposed along a first laminar edge of said interconnector apparatus, said receptacles being coactable with said pins, and others of said contact means further comprising printed circuit lands disposed along a second laminar edge of said interconnector apparatus, said lands being connectable with said contact pads of said printed circuit board, said first and second laminar edges being normal to said first and second planar sides.

3. Electrical interconnector apparatus for interconnecting the terminals of at least two electrical devices, said apparatus comprising:

plural modular sections, each of said sections comprising:

one lamination having first and second predetermined printed circuit conductor patterns on the opposing first and second planar sides, respectively, of said lamination, severable conductor means for connecting said first and second predetermined patterns at predetermined locations across at least one edge of said lamination, and first and second reference voltage plane laminations disposed adjacent said first and second conductor patterns, respectively, said first and second conductor patterns being in signal plane relationships with said first and second reference voltage plane laminations, respectively, in a microstrip manner, plural insulator planar spacer members interleaved between adjacent modular sections, and contact means disposed along at least one laminar edge of said interconnector apparatus adapted to be connectable to said electrical device terminals, said contact means being coupled to predetermined ones of the printed circuit conductors of at least one of said first and second patterns, said one laminar edge being normal to said first and second planar sides, recesses formed in at least one edge of said one lamination, some of said contact means being located within said recesses.

4. Electrical interconnector apparatus according to claim 3 wherein each of said reference voltage plane laminations comprises a planar dielectric substrate with one side having a conductive layer disposed thereon.

5. Electrical interconnector apparatus for interconnecting the terminals of at least two electrical devices, said apparatus comprising:

plural modular sections, each of said sections comprising:

one lamination having first and second predetermined printed circuit conductor patterns on the opposing first and second planar sides, respectively, of said lamination, severable conductor means for connecting said first and second predetermined patterns at predetermined locations across at least one edge of said lamination, and first and second reference voltage plane laminations disposed adjacent said first and second conductor patterns, respectively, said first and second conductor patterns being in signal plane relationships with said first and second reference voltage plane laminations, respectively, plural insulator spacer means interleaved between adjacent modular sections, and contact means disposed along at least one laminar edge of said interconnector apparatus adapted to be connectable to said electrical device terminals, said contact means being coupled to predetermined ones of the printed circuit conductors of at least one of said first and second patterns, and wherein each of said first reference voltage plane laminations comprises a planar dielectric substrate with one side having a conductive layer disposed thereon, and wherein each of said second reference voltage plane laminations is comprised of a mutually exclusive one of said insulator spacer means and said conductive layer of a mutually exclusive one of said first reference voltage plane laminations adjacent thereto, each of said insulator spacer means being a planar dielectric.

6. Electrical interconnector apparatus according to claim 3 wherein one of said two devices is a pluggable circuit module having pins as said terminals thereof, and wherein the other of said two devices is a printed circuit board having a predetermined printed circuit conductor third pattern including printed circuit contact pads as said terminals thereof, some of said contact means comprising receptacles disposed along a first laminar edge of said interconnector apparatus, said receptacles being coactable with said pins, and others of said contact means further comprising printed circuit lands disposed along a second laminar edge of said interconnector apparatus, said lands being connectable with said contact pads of said printed circuit board, said first and second laminar edges being normal to said first and second planar sides.

7. Electrical laminated interconnector apparatus for interconnecting the terminals of a plurality of pluggable circuit modules each having plural pin type terminals and a printed circuit board having a printed circuit conductor pattern with predetermined printed circuit contact pads, said apparatus comprising:

plural modular sections, each of said sections comprising:

one lamination having first and second predetermined printed circuit conductor patterns on the opposing first and second planar sides, respectively, of said lamination, severable plural printed circuit conductor means for connecting said first and second predetermined patterns at predetermined locations across at least one edge of said lamination, and first and second reference voltage plane laminations disposed adjacent said first and second conductor patterns, respectively, said first and second conductor patterns being in signal plane relationships with said first and second reference voltage plane laminations, respectively, in a microstrip manner, a plurality of insulator planar spacer members interleaved between adjacent said modular sections, plural printed circuit lands disposed along a predetermined laminar edge of each of said one laminations having said first and second conductor patterns, said lands being connectable with said contact pads of said printed circuit board and being coupled to predetermined ones of the printed circuit conductors of at least one of said first and second patterns, and plural receptacles disposed in recesses formed in at least one of the remaining laminar edges of each of said one laminations having said first and second conductor patterns, said receptacles being coactable with said pin terminals and coupled to predetermined ones of the printed circuit conductors of at least one of said first and second patterns, said laminar edges being normal to said first and second planar sides.

8. Electrical laminated interconnector apparatus according to claim 7 wherein each pair of adjacent said sections and the particular interleaved said spacer means therebetween is configured to provide a wire conductor raceway.

9. Electrical laminated interconnector apparatus according to claim 7 wherein in each section said receptacles are housed in recesses inwardly formed along the at least said one of the remaining laminar edges of said one lamination having said first and second conductor patterns, and said first and second reference voltage plane laminations of the particular section are configured to enclose the sides of said recesses.

10. Electrical laminated interconnector apparatus for interconnecting the terminals of a plurality of pluggable circuit modules each having plural pin type terminals and a printed circuit board having a printed circuit conductor pattern with predetemined printed circuit contact pads, said apparatus comprising:

plural modular sections, each of said sections comprising:

one lamination having first and second predetermined printed circuit conductor patterns on the opposing first and second planar sides, respectively, of said lamination, severable plural printed circuit conductor means for connecting said first and second predetermined patterns at predetermined locations across at least one edge of said lamination, and first and second reference voltage plane laminations disposed adjacent said first and second conductor patterns, respectively, said first and second conductor patterns being in signal plane relationships with said first and second reference voltage plane laminations, respectively, a plurality of insulator spacer means interleaved between adjacent said modular sections, plural printed circuit lands disposed along predetermined laminar edge of each of said one laminations having said first and second conductor patterns, said lands being connectable with said contact pads of said printed circuit board and being coupled to predetermined ones of the printed circuit conductors of at least one of said first and second patterns, and plural receptacles disposed along at least one of the remaining laminar edges of each of said one laminations having said first and second conductor patterns, said receptacles being coactable with said pin terminals and coupled to predetermined ones of the printed circuit conductors of at least one of said first and second patterns, and wherein each of said first reference voltage plane laminations comprises a planar dielectric substrate with one side having a conductive layer disposed thereon, and wherein each of said second reference voltage plane laminations is comprised of a mutually exclusive one of said insulator spacer means and said conductive layer of a mutually exclusive one of said first ground plane laminations adjacent thereto, each of said insulator spacer means being a planar dielectric.

* * * * *